United States Patent
Batra et al.

(10) Patent No.: US 9,536,809 B2
(45) Date of Patent: Jan. 3, 2017

(54) COMBINATION OF TSV AND BACK SIDE WIRING IN 3D INTEGRATION

(71) Applicant: International Business Machines Corporation, Armonk, NY (US)

(72) Inventors: Pooja R. Batra, White Plains, NY (US); John W. Golz, Manassas, VA (US); Subramanian S. Iyer, Mount Kisco, NY (US); Douglas C. La Tulipe, Jr., Guilderland, NY (US); Spyridon Skordas, Wappingers Falls, NY (US); Kevin R. Winstel, East Greenbush, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/839,994

(22) Filed: Aug. 30, 2015

(65) Prior Publication Data
US 2015/0371927 A1    Dec. 24, 2015

Related U.S. Application Data

(62) Division of application No. 14/142,599, filed on Dec. 17, 2013.

(51) Int. Cl.
| H01L 23/48 | (2006.01) |
| H01L 25/065 | (2006.01) |
| H01L 21/768 | (2006.01) |
| H01L 25/00 | (2006.01) |
| H01L 23/528 | (2006.01) |
| H01L 23/00 | (2006.01) |

(52) U.S. Cl.
CPC ....... H01L 23/481 (2013.01); H01L 21/76898 (2013.01); H01L 23/528 (2013.01);
(Continued)

(58) Field of Classification Search
CPC .......... H01L 24/80; H01L 24/83; H01L 24/94; H01L 2225/06548; H01L 23/481; H01L 23/528; H01L 25/0657; H01L 21/76898
(Continued)

(56) References Cited

U.S. PATENT DOCUMENTS 7,855,101 B2    12/2010 Furman et al.
8,048,794 B2    11/2011 Knickerbocker
(Continued)

FOREIGN PATENT DOCUMENTS

EP    2273545 A1    1/2011
EP    2413150 A1    2/2012

OTHER PUBLICATIONS

Disclosed Anonymously;Method for Direct Chip Attachment Using Die Back-Side Power Delivery and Through-Silicon Vias; IP.com No. IPCOM000008596D, Jun. 25, 2002.

Primary Examiner — Kenneth Parker
Assistant Examiner — Bo Fan
(74) Attorney, Agent, or Firm — Steven J. Meyers; Howard M. Cohn

(57) ABSTRACT

The embodiments of the present invention relate generally to the fabrication of integrated circuits, and more particularly to a structure and method for fabricating a 3D integration scheme for multiple semiconductor wafers using an arrangement of intra-wafer through silicon vias (TSVs) to electrically connect the front side of a first integrated circuit (IC) chip to large back side wiring on the back side of the first IC chip and inter-wafer TSVs to electrically connect the first IC chip to a second IC chip.

3 Claims, 7 Drawing Sheets

(52) U.S. Cl.
CPC .......... *H01L 24/32* (2013.01); *H01L 25/0657* (2013.01); *H01L 25/50* (2013.01); *H01L 2224/29082* (2013.01); *H01L 2224/32145* (2013.01); *H01L 2225/06541* (2013.01); *H01L 2225/06544* (2013.01); *H01L 2924/0002* (2013.01); *H01L 2924/14* (2013.01)

(58) Field of Classification Search
USPC ........ 438/459, 667, 653; 257/774, 777, 691, 257/758
See application file for complete search history.

(56) References Cited

U.S. PATENT DOCUMENTS

| | | | |
|---|---|---|---|
| 8,247,895 B2 | 8/2012 | Haensch et al. | |
| 8,264,067 B2 | 9/2012 | Law et al. | |
| 8,563,403 B1* | 10/2013 | Farooq | H01L 24/80 257/E21.597 |
| 2001/0017418 A1* | 8/2001 | Noguchi | H01L 23/5222 257/758 |
| 2009/0191708 A1* | 7/2009 | Kropewnicki | H01L 21/76898 438/667 |
| 2010/0187683 A1 | 7/2010 | Bakir et al. | |
| 2011/0241082 A1 | 10/2011 | Bernstein et al. | |
| 2012/0077312 A1* | 3/2012 | Lee | H01L 21/563 438/108 |
| 2012/0162947 A1 | 6/2012 | O'Donnell et al. | |
| 2012/0267788 A1 | 10/2012 | Hong et al. | |
| 2012/0315753 A1 | 12/2012 | Farooq et al. | |
| 2013/0001799 A1 | 1/2013 | Chang et al. | |
| 2013/0026606 A1 | 1/2013 | Farooq et al. | |
| 2014/0239457 A1* | 8/2014 | Daubenspeck | H01L 23/34 257/621 |

* cited by examiner

COMBINATION OF TSV AND BACK SIDE WIRING IN 3D INTEGRATION

CROSS REFERENCE TO RELATED APPLICATIONS

This application is a division of commonly-owned, copending U.S. patent application Ser. No. 14/142,599 entitled COMBINATION OF TSV AND BACK SIDE WIRING IN 3D INTEGRATION, and filed on Dec. 27, 2013.

BACKGROUND

The present invention relates generally to electronic components such as semiconductor wafers, and more particularly, to a 3D integration scheme for multiple semiconductor wafers using an arrangement of through silicon vias (TSVs) and back side wiring.

As packaging density in semiconductor devices continues to increase in order to accommodate more devices into a package, three-dimensional (3D) wafer-to-wafer stacking technology has become more widely used in the industry. Typically, a semiconductor wafer includes several layers of integrated circuitry (IC) (e.g., processors, programmable devices, memory devices, etc.) built on a silicon substrate. A top layer of the wafer may be connected to a bottom layer of the wafer by through-silicon vias (TSVs) or interconnects. In order to form a 3D wafer stack, two or more wafers are placed on top of one another and bonded.

3D wafer stacking technology offers a number of potential benefits, including, for example, improved form factors, lower costs, enhanced performance, and greater integration through system-on-chip (SOC) solutions. In addition, the 3D wafer stacking technology may provide other functionality to the chip. For instance, after being formed, the 3D wafer stack may be diced into stacked dies or chips, with each stacked chip having multiple tiers (i.e., layers) of integrated circuitry. SOC architectures formed by 3D wafer stacking can enable high bandwidth connectivity of products such as, for example, logic circuitry and dynamic random access memory (DRAM), that otherwise have incompatible process flows. At present, there are many applications for 3D wafer stacking technology, including high performance processing devices, video and graphics processors, high density and high bandwidth memory chips, and other SOC solutions.

SUMMARY

According to one embodiment of the present invention, a method is disclosed. The method may include: forming an intra-wafer through substrate via (TSV) in a front side of a first substrate, the intra-wafer TSV having a height less than the total height of the first substrate; forming a front side wiring layer on the front side of the first substrate to form a first integrated circuit (IC) chip, the front side wiring layer being electrically connected to the intra wafer TSV; forming a first bonding layer over the front side wiring layer; bonding the first IC chip to a second IC chip, the bond formed between the first bonding layer of the first IC chip and a second bonding layer of the second IC chip; removing a portion of a back side of the first substrate to expose the intra wafer TSV, the back side of the first substrate is opposite the front side; forming a back side wiring layer on the back side of the first substrate, the back side wiring layer being electrically connected to the intra wafer TSV; and forming an inter-wafer TSV extending through an entire thickness of the back side wiring layer, the first IC chip, the first bonding layer, the second bonding layer, and the second IC chip, the inter-wafer TSV providing an electrical connection between the second IC chip and the back side wiring layer of the first IC chip.

According to another embodiment of the present invention, a method is disclosed. The method may include: forming an intra-wafer through substrate via (TSV) through an entire thickness of a first integrated circuit (IC) chip; bonding the first IC chip to a second IC chip; and forming an inter-wafer TSV through both the first IC chip and the second IC chip.

According to another embodiment of the present invention, a structure is disclosed. The structure may include: a first integrated circuit (IC) chip having, a first substrate, a front side wiring layer on a front side of the first substrate, a back side wiring layer on a back side of the substrate, and an intra-wafer through substrate via (TSV) extending through an entire thickness of a first substrate and electrically connecting the front side wiring layer to the back side wire layer; a first bonding layer on the front side wiring layer; a second bonding layer on the first bonding layer; a second IC chip on the second bonding layer; and an inter-wafer TSV extending through an entire thickness of the first IC chip, the first bonding layer, the second bonding layer, and the second IC chip, the inter-wafer TSV electrically connecting the first IC chip to the second IC chip

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
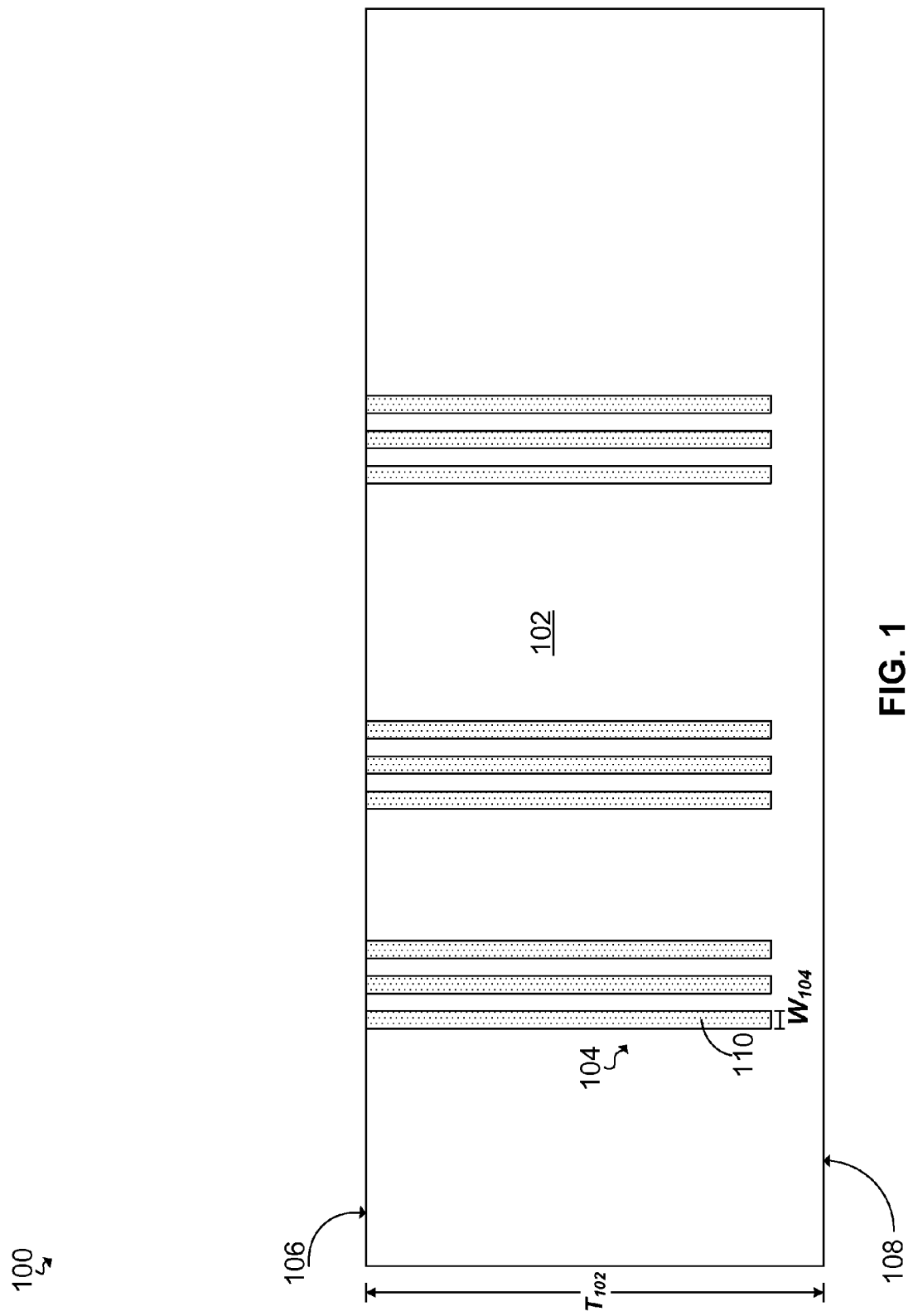
FIG. 1 is a cross-sectional view illustrating forming multiple intra-wafer TSVs in a semiconductor substrate, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to electronic components such as semiconductor wafers, and more particularly, to a 3D integration scheme for multiple semiconductor wafers using an arrangement of through silicon vias (TSVs) and back side wiring. One way to implement the 3D integration scheme for multiple semiconductor wafers may include using a combination of small intra-wafer TSVs and back side wiring in conjunction with larger inter-wafer TSVs. An embodiment by which to implement a 3D integration scheme for multiple semiconductor wafers using an arrangement of through silicon vias (TSVs) and back side wiring is described in detail below by referring to the accompanying drawings FIGS. 1-7.

It should be appreciated that although specific wafer substrate bonding process flows are depicted herein, such descriptions are exemplary only, and that the principles disclosed herein are also applicable to various types of TSV conductive materials, dielectric, and adhesive interface materials, and multiple types of semiconductor wafers and substrates. As such, the acronym "TSV" may also be used to more generally refer to "through substrate via" in addition to the conventional "through silicon via" meaning. Moreover, such bonding may include bonding one or more wafers, each having multiple IC chips formed on them, in arrangements such as face-to-face, face-to-back, and face-to-face-to-back bonding, and such bonded structures may also incorporate microelectromechanical system (MEMS) structures as well.

Referring now to FIG. 1, a cross-sectional view of a structure 100 is shown. FIG. 1 illustrates forming multiple intra-wafer TSVs 104 in a semiconductor substrate 102 using known techniques. In one embodiment, the semiconductor substrate 102 can be composed of a bulk semiconductor substrate made from any of several known semiconductor materials such as, for example, Si, strained Si, Ge, SiGe, Si:C, SiGeC, Si alloys, Ge alloys, and compound (e.g. III-V and II-VI) semiconductor materials. Non-limiting examples of compound semiconductor materials include GaAs, InAs, and InP, or any combination thereof. The semiconductor substrate 102 can be approximately, but is not limited to, several hundred microns thick. For example, the semiconductor substrate 102 thickness $T_{102}$ may range from approximately 10 µm to approximately 1000 µm, although the thickness range can change depending on the applications involved.

Although not depicted in FIG. 1, the semiconductor substrate 102 can also be composed of a semiconductor on insulator (SOI) substrate. SOI substrates are typically composed of at least an SOI layer overlying a dielectric layer, often referred to as a buried dielectric layer. A base semiconductor layer can be present below the dielectric layer. The SOI layer and the base semiconductor layer can be composed of similar materials as the bulk semiconductor substrate described above. The buried dielectric layer can be formed by implanting a high-energy dopant into a bulk semiconductor substrate, and then annealing the structure to form a buried oxide layer. In another embodiment, the buried dielectric layer can be deposited or grown prior to the formation of the SOI layer. In yet another embodiment, the SOI substrate can be formed using wafer-bonding techniques, where a bonded wafer pair is formed using glue, an adhesive polymer, or direct bonding. The buried dielectric layer can have a thickness ranging from approximately 100 nm to approximately 500 nm thick. The SOI layer can have a thickness similar to the buried dielectric layer and the base semiconductor layer can have a thickness ranging from approximately 10 µm to approximately 1000 µm, although the working thickness range may vary depending on the applications.

The intra-wafer TSVs 104 may be formed by any known patterning and etching process suitable to form TSVs. In one embodiment, the intra-wafer TSVs 104 may be formed by forming a photoresist layer (not shown) over a front side 106 of the semiconductor substrate 102 and above any FEOL structures (not shown) present thereon. The photoresist layer may then be patterned using a photolithography process to expose portions of the semiconductor substrate 102. The exposed portions of the semiconductor substrate 102 may then be etched, preferably using a dry etching process such as reactive ion etching (RIE) to form TSV trenches (not shown). An insulating liner (not shown) may then be formed within the TSV trenches (not shown).

Next, the TSV trenches (not shown) may be filled with a conductive material 110 using any known technique, such as, for example, depositing or electroplating. In an embodiment, a seed layer (not shown) may be deposited within the TSV trenches (not shown), and on top of the insulating liner (not shown) to facilitate electroplating the conductive material 110. A planarization process, such as chemical mechanical planarization (CMP), may then be performed to remove any excess material.

The conductive material 110 may include, but is not limited to, copper (Cu), tungsten (W), alloys thereof, or other metallic materials of sufficiently low resistivity. The insulating liner (not shown) may be silicon oxide or silicon nitride or other insulator material. The seed layer (not shown) may be formed on the insulating liner (not shown) and may act as an adhesive and diffusion barrier for the conductive material 110. The seed layer (not shown) may be composed of one or more layers of a metal nitride, such as, for example titanium nitride (TiN), tantalum nitride (TaN) or other such suitable material.

It should be noted that the intra-wafer TSVs 104 may not extend through the entire thickness $T_{102}$ of the semiconductor substrate 102. A bottom of the intra-wafer TSVs 104 may be exposed after a back side 108 of the semiconductor substrate 102 is thinned or recessed in a subsequent process step described below with reference to FIG. 5. In one embodiment, each of the intra-wafer TSVs 104 may have a width $W_{104}$ ranging from approximately 0.05 µm to approximately 0.5 µm. In another embodiment, each of the intra-wafer TSVs 104 may have a width $W_{104}$ ranging from approximately 0.1 µm to approximately 0.4 µm. In one embodiment, the intra-wafer TSVs 104 may have a width to height ratio of approximately 1:40, and as such may be referred to as high-aspect ratio TSVs. It should be noted that the fabrication techniques described above with respect to the intra-wafer TSVs 104 may be specifically chosen for their suitability in fabricating high-aspect ratio TSVs.

It should also be noted that the intra-wafer TSVs 104 may be formed in the semiconductor substrate 102 at multiple points during fabrication. In an embodiment, the intra-wafer TSVs 104 may be formed after the front end of the line (FEOL) structures (not shown) have been formed in a FEOL layer (not shown) on the front side 106 of the semiconductor substrate 102. The intra-wafer TSVs 104 may be formed by patterning over and etching through the FEOL layer (not shown) preferably during FEOL/middle of the line (MOL) processing or, at the latest, during formation of a $M_x$ layer.

In another embodiment, the intra-wafer TSVs 104 may be formed later in the process, after the formation of the FEOL structures and front side wiring levels (FIG. 2), and after a back side 108 of the semiconductor substrate 102 is thinned using known techniques. The intra-wafer TSVs 104 may thereby be formed by etching through an entire thickness of the thinned semiconductor substrate 102 from the back side 108 to form backside trenches (not shown). In this embodiment, a "bottom" of the backside trenches (not shown) may be in contact with a landing pad (not shown) formed on the front side 106 of the semiconductor substrate 102 during earlier FEOL processing. The landing pad (not shown) may be composed of a conductive material having a different etch rate than the semiconductor substrate 102, and may serve as an etch stop during the formation of the backside trenches (not shown). Intra-wafer TSVs 104 may then be formed by filling the backside trenches (not shown) with a conductive material using substantially similar techniques as those described above. In an embodiment, an anisotropic etch, such as, for example, RIE, may be performed to remove only a bottom portion of an insulating liner (not shown) from the bottom of the backside trenches (not shown). The bottom portion of the insulating liner is removed to ensure electrical connectivity through the entire length of the intra-wafer TSVs 104, and specifically between the conductive material of the TSV and the corresponding landing pad.

Figure 2:
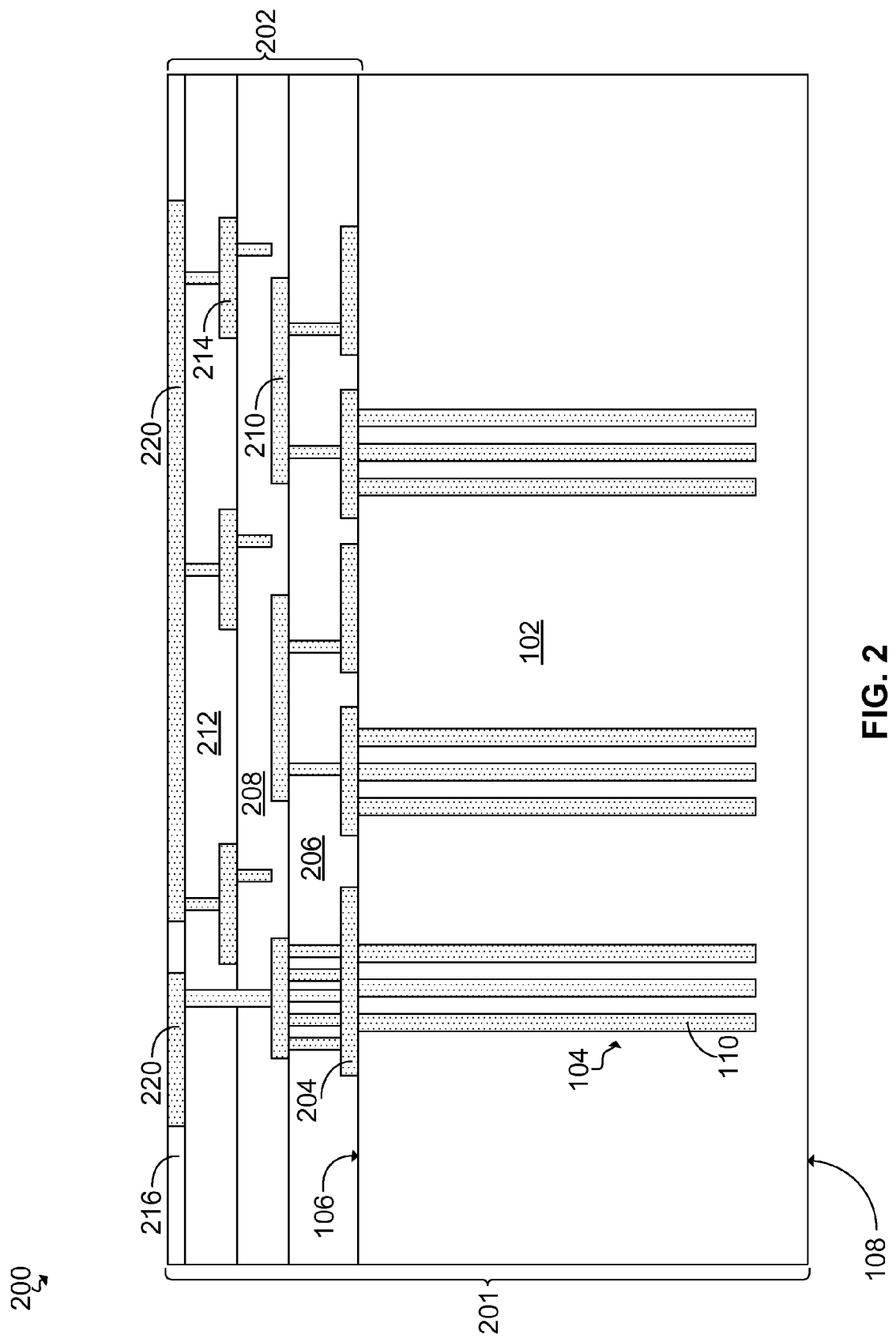
FIG. 2 is a cross-sectional view illustrating forming wiring layers on the semiconductor substrate, according to an embodiment of the present invention.

Referring now to FIG. 2, a cross-sectional view of a structure 200 is shown. FIG. 2 illustrates forming one or more wiring layers 202 above the FEOL structures (not shown) on the structure 100 to form a first integrated circuit (IC) chip 201 (hereinafter "first IC chip"). In one embodiment, the first IC chip 201 may represent a memory chip having FEOL, MOL, and back end of the line (BEOL) structures formed thereon, as known in the art. However, it should be noted that the first IC chip 201 could be a processor chip or a wafer with any type of IC devices present on it, including wafer multi-stacks. The methods presented herein can therefore be used for homogeneous wafer bonding/stacking (i.e., memory to memory, logic to logic, etc.) or heterogeneous wafer bonding/stacking (i.e., memory to logic, etc.).

It will be appreciated that the wiring layers 202 are illustrative only. In an actual device, there may be several layers of insulator materials and associated wiring formed therein. In an embodiment, the wiring layers 202 may include the $M_x$ layer 206 having $M_x$ wiring 204, a $M_{x+1}$ layer 208 having $M_{x+1}$ wiring 210, a $M_{x+2}$ layer 212 having $M_{x+2}$ wiring 214, and a $M_{x+3}$ layer 216 having $M_{x+3}$ wiring 220. The $M_x$ layer 206, the $M_{x+1}$ layer 208, the $M_{x+2}$ layer 212, and the $M_{x+3}$ layer 216 may be composed of an insulator, such as a dielectric. The dielectric may include any suitable dielectric material, for example, silicon oxide, silicon nitride, hydrogenated silicon carbon oxide, silicon based low-k dielectrics, porous dielectrics, or organic dielectrics including porous organic dielectrics. The $M_x$ layer 206, the $M_{x+1}$ layer 208, the $M_{x+2}$ layer 212, and the $M_{x+3}$ layer 216 may be formed using known suitable deposition techniques, such as, for example, atomic layer deposition (ALD), chemical vapor deposition (CVD), plasma enhanced chemical vapor deposition (PECVD), spin on deposition, or physical vapor deposition (PVD). The $M_x$ layer 206, the $M_{x+1}$ layer 208, the $M_{x+2}$ layer 212, and the $M_{x+3}$ layer 216 may each have a thickness ranging from approximately 70 nm to approximately 140 nm, although greater and lesser thicknesses are explicitly contemplated.

The $M_x$ wiring 204, the $M_{x+1}$ wiring 210, the $M_{x+2}$ wiring 214, and the $M_{x+3}$ wiring 220 may be, for example, typical lines, vias, or wires found in a typical wiring structure. The $M_x$ wiring 204, the $M_{x+1}$ wiring 210, the $M_{x+2}$ wiring 214, and the $M_{x+3}$ wiring 220 may be made of a conductive interconnect material including, for example, copper, aluminum, or tungsten. The conductive interconnect material may be formed using a conventional patterning/etching technique such as, photolithography and RIE, and a conventional filling technique such as electroplating, electroless plating, chemical vapor deposition, physical vapor deposition or a combination of methods. The conductive interconnect material may further include a dopant, such as, for example, manganese, magnesium, copper, aluminum, or other known dopants. In some embodiments, various liners (not shown) may be formed in the $M_x$ wiring 204, the $M_{x+1}$ wiring 210, the $M_{x+2}$ wiring 214, and the $M_{x+3}$ wiring 220. In one embodiment, a liner may include, for example, a tantalum nitride layer, followed by a tantalum layer. Other barrier liners may include manganese, cobalt or ruthenium, either alone or in combination with any other suitable liner.

In an embodiment, the $M_x$ wiring 204, the $M_{x+1}$ wiring 210, the $M_{x+2}$ wiring 214, and the $M_{x+3}$ wiring 220 may have a width that is substantially similar to the width of the intra-wafer TSVs 104. This may allow for a connection of the intra-wafer TSVs 104 directly to the FEOL structures (not shown) and the wiring layers 202 without significant modification, thereby minimizing any area penalty from the intra-wafer TSVs 104 on the front side 106 of the first IC chip 201.

The wiring layers 202 may include one or more switches (not shown) for selectively switching power locally after stacking/bonding and integration. The one or more switches (not shown) may be made up electronic circuits connected to the intra-wafer TSVs 104. The one or more switches (not shown) may provide an option to turn off only specific defective sections of the first IC chip 201 while keeping rest of the chip powered on.

Figure 3:
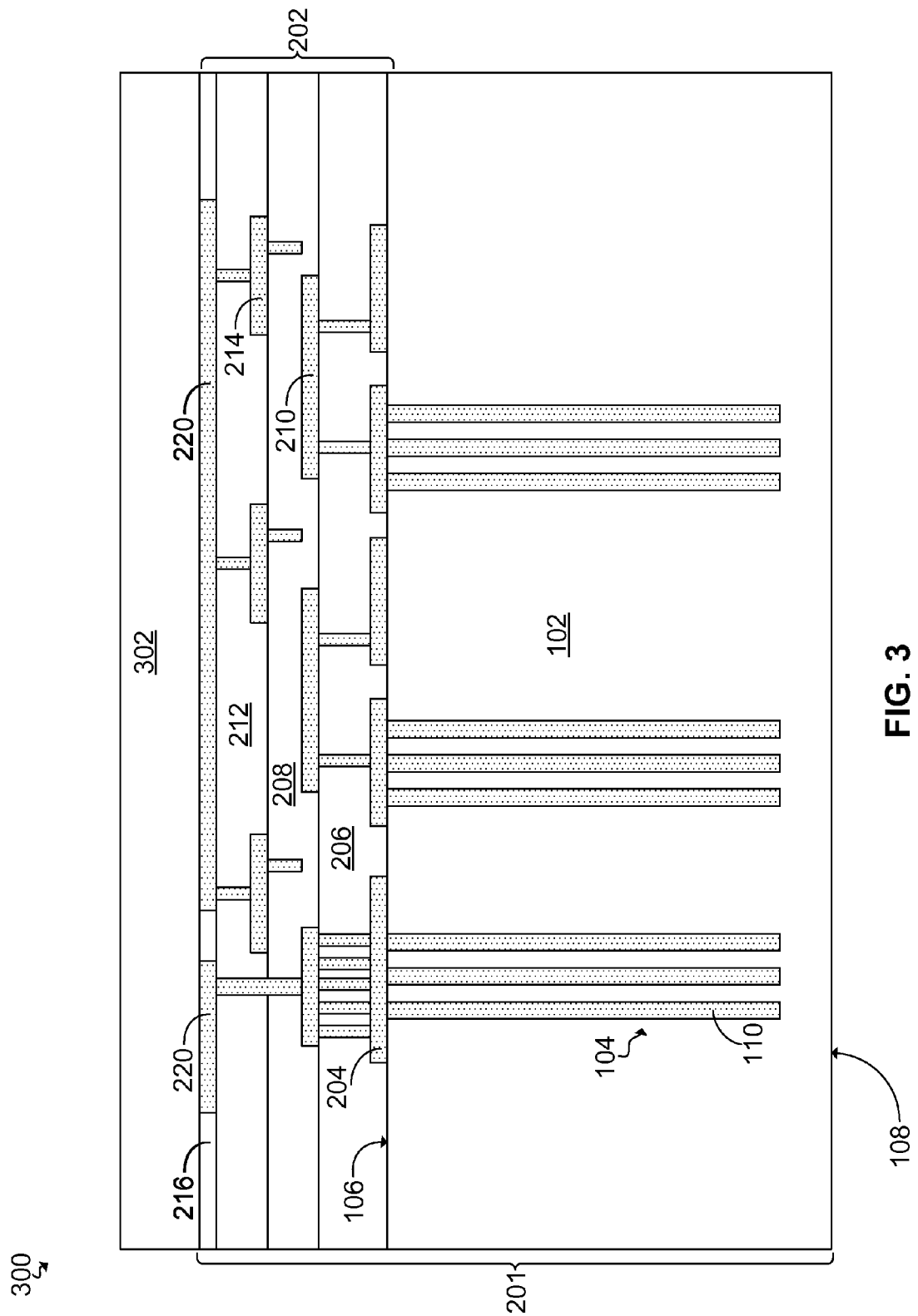
FIG. 3 is a cross-sectional view illustrating forming a first passivation layer on the structure shown in FIG. 2, according to an embodiment of the present invention.

Referring now to FIG. 3, a cross-sectional view of a structure 300 is shown. FIG. 3 illustrates forming a first bonding layer 302 on the first IC chip 201 in preparation of chip bonding. The first bonding layer 302 may be composed of an oxide, or other suitable type of insulator material (including any permanent adhesive material). In an embodiment, the first bonding layer 302 may also include metal regions (not shown) defined therein to serve as electric contacts to a second IC chip. The first bonding layer 302 may be formed using known suitable deposition techniques, such as, for example, ALD, CVD, PECVD, spin on deposition, or PVD. It should be noted that although the first bonding layer 302 is illustrated as one layer, it is contemplated that the first bonding layer 302 may be composed of multiple layers.

Figure 4:
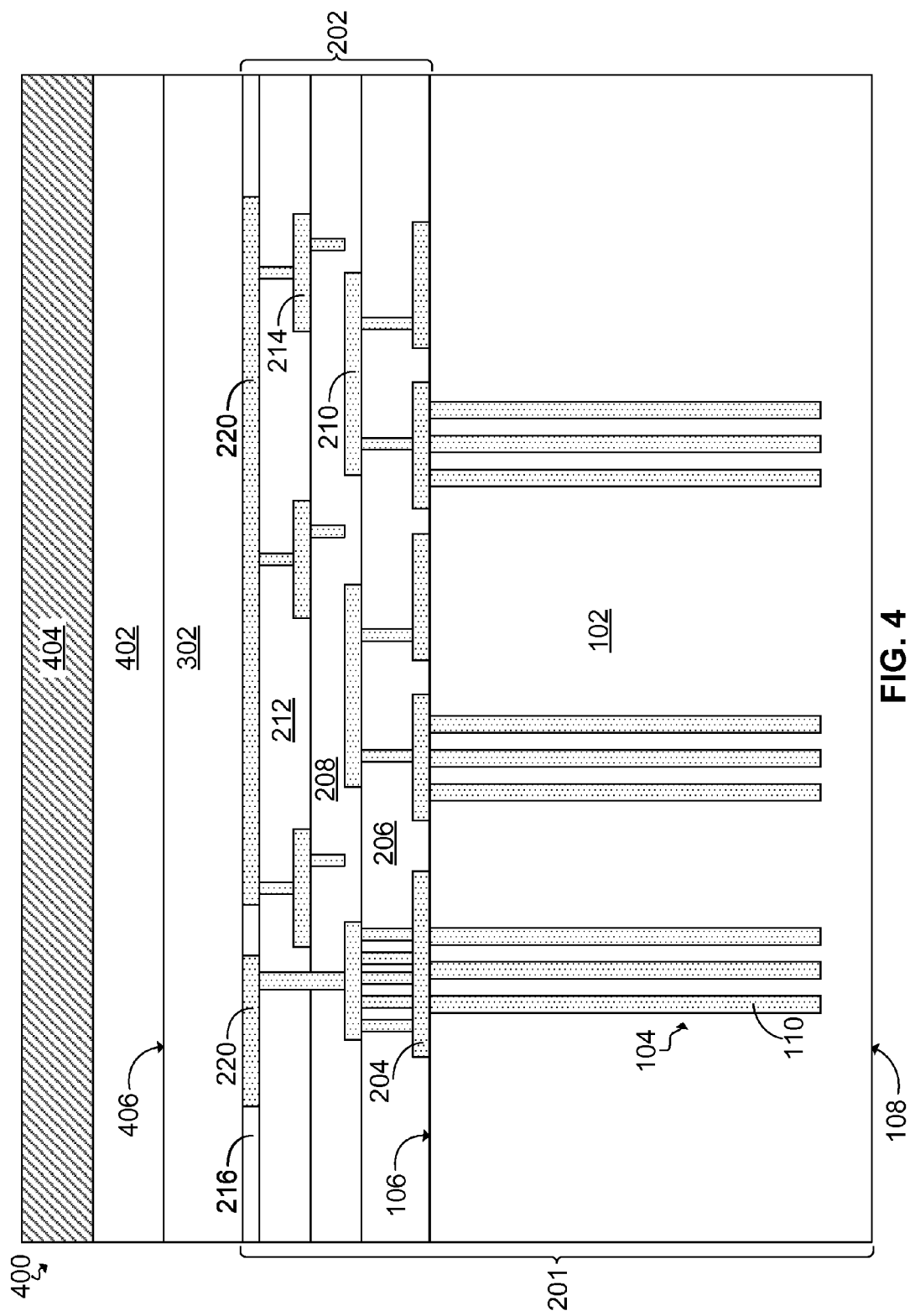
FIG. 4 is a cross-sectional view illustrating bonding the structure shown in FIG. 3 to a second wafer, according to an embodiment of the present invention.

Referring now to FIG. 4, a cross-sectional view of a structure 400 is shown. FIG. 4 illustrates joining the first IC chip 201 to a second IC chip 404 by bonding the first bonding layer 302 on the first IC chip 201 to a second bonding layer 402 on a second IC chip 404. The second bonding layer 402 may be substantially similar to the first bonding layer 302 and formed using substantially similar techniques as those described above in reference to FIG. 3. In an embodiment in which an oxide is used to form the first bonding layer 302 and the second bonding layer 402, oxide-to-oxide bonding (e.g., surface activation, cleaning, initial bonding, and annealing) may be used to bond the first bonding layer 302 and the second bonding layer 402 together. In addition, permanent adhesive bonding, or any other suitable technique in the art that results in a strong bond between electrically insulating layers may be used. Other exemplary techniques may include metal-to-metal thermal compression bonding, or other known hybrid bonding techniques. In an embodiment, the first IC chip 201 and the second IC chip 404 may be present on a first wafer (not shown) and a second wafer (not shown) respectively, each having multiple IC circuits formed thereon, and may be aligned and bonded together during a wafer bonding process in which the first wafer (not shown) and the second wafer (not shown) are joined. A bonding interface 406 may be formed between the first bonding layer 302 and the second bonding layer 402. The bonding interface 406 may be composed entirely of insulating materials, or of insulating materials having a conductive regions (not shown) therein.

It should be noted that the second IC chip 404 may be a memory chip, or a processor chip, having FEOL, MOL, and BEOL structures (not shown) formed thereon, as known in the art. More generally, the second chip 404 may be a wafer with any type of IC devices present on it. Even more generally, the first IC chip 201 and the second IC chip 404 may both represent any type of IC devices formed on a substrate where it is desired to integrate the same or other types of integrated circuit devices in a 3D fashion.

Figure 5:
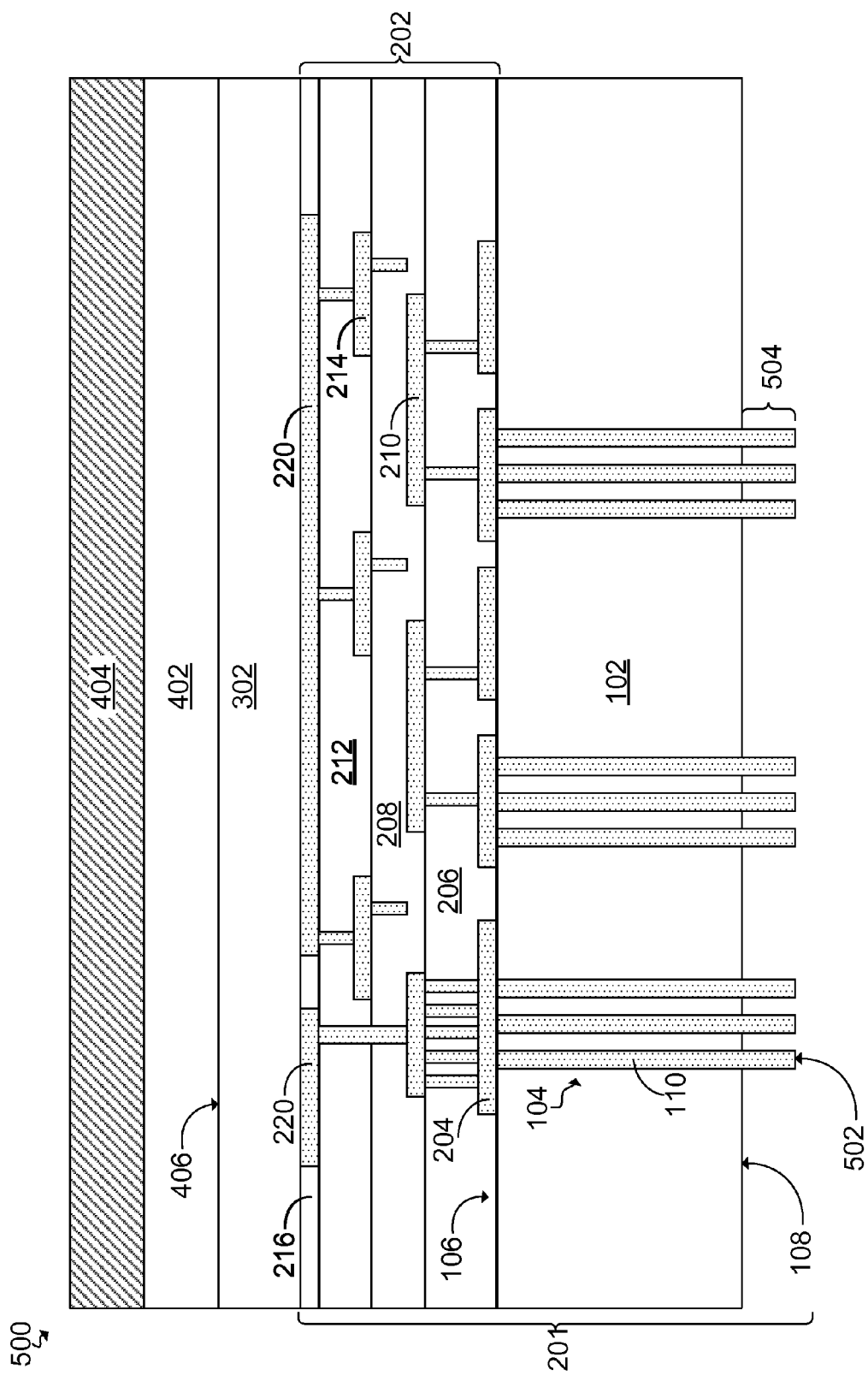
FIG. 5 is a cross-sectional view illustrating removing a portion of the back side of the semiconductor substrate, according to an embodiment of the present invention.

Referring now to FIG. 5, a cross-sectional view of a structure 500 is shown. FIG. 5 illustrates the structure 400 after a portion of the back side 108 of the semiconductor substrate 102 is recessed to expose the intra-wafer TSVs 104. In an embodiment, the portion of the back side 108 may be recessed using any known technique, including, for example, hydrofluoric/nitric/acetic (HNA) acid etching, reactive ion etching (RIE), or combinations thereof. In such cases, as illustrated in the figure, the recess technique may remove only portions of the substrate 102 selective to the intra-wafer TSVs 104, resulting in portions of the intra-wafer TSVs 504 remaining above the back side 108. In an embodiment in which the intra-wafer TSVs 104 include an insulating liner (not shown), an etching process, such as RIE, may be used to remove portions of the insulating liner (not shown) so that a bottom TSV surface 502, composed of the conductive material 110, is exposed. This allows for a conductive path through the entire thickness of the semiconductor substrate 102.

In another embodiment, the portion of the back side 108 may be recessed using a substantially non-selective technique, including, for example, grinding, chemical mechanical planarization (CMP), or combinations thereof. In such cases, the recess technique may also remove portions of the intra-wafer TSVs 104 so that a bottom TSV surface 502 is exposed. In this embodiment, the bottom surface 502 may be substantially coplanar with the back side 108 of the semiconductor substrate 102. In another embodiment, the removal of the portion of the back side 108 may be stopped at a point where a thin layer of the semiconductor substrate 102 is present over the intra-wafer TSVs 104, which are not exposed. A conventional lithography and etching process, such as, for example, RIE, may then be used to form TSV contacts (not shown) through an entire thickness of the thin layer of the semiconductor substrate 102 to contact the intra-wafer TSVs.

Figure 6:
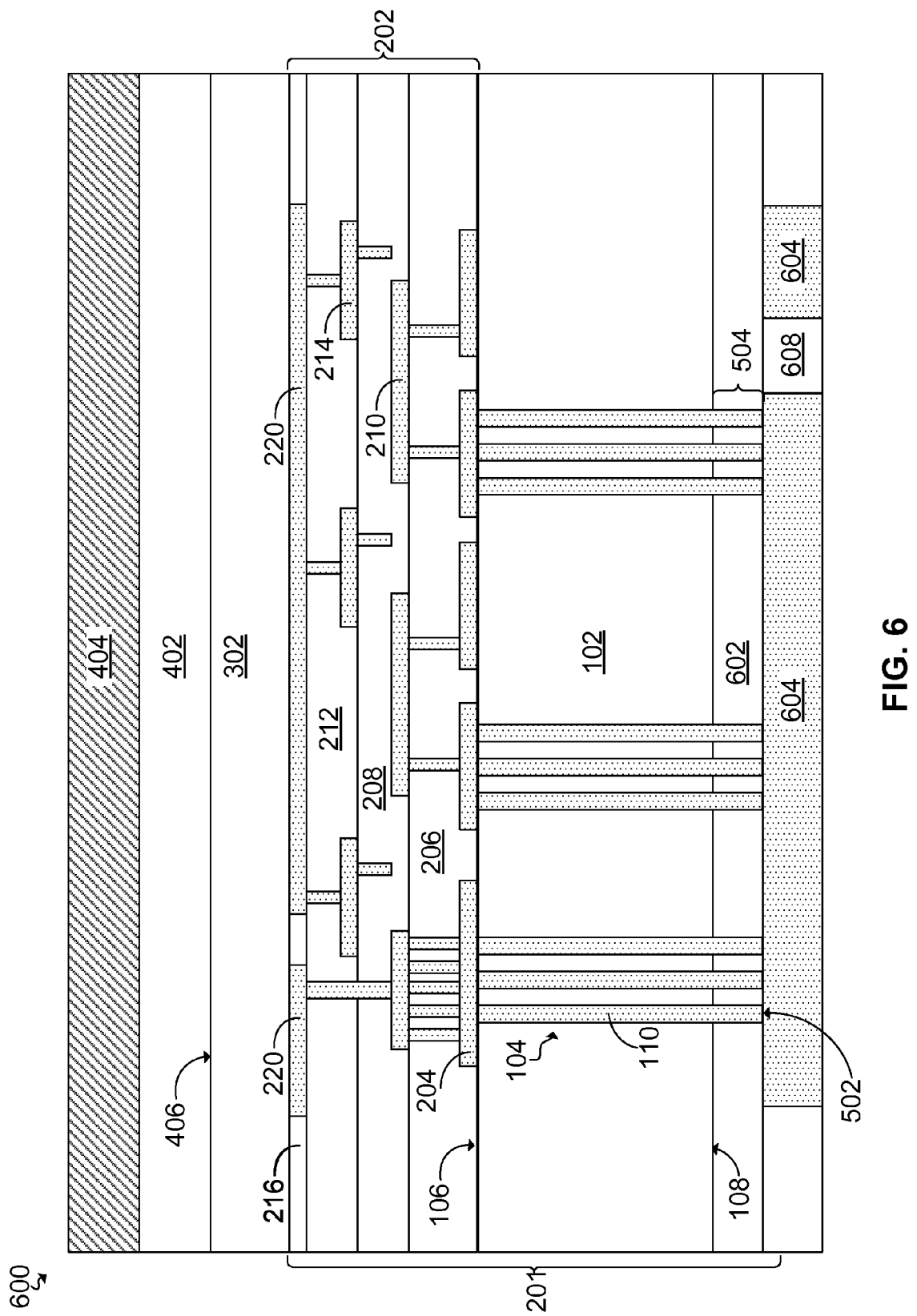
FIG. 6 is a cross-sectional view illustrating forming a back side dielectric layer and back side wiring on the back side of the semiconductor wafer, according to an embodiment of the present invention.

Referring now to FIG. 6, a cross-sectional view of a structure 600 is shown. FIG. 6 illustrates forming a back side dielectric layer 602 and back side wiring 604 on the structure 500. The a back side dielectric layer 602 may be formed on the back side 108 of the semiconductor wafer 102. The back side dielectric layer 602 may be substantially similar to the $M_x$ layer 206, the $M_{x+1}$ layer 208, the $M_{x+2}$ layer 212, and the $M_{x+3}$ layer 216 and may be formed using substantially similar techniques as those described above with reference to FIG. 2. In an embodiment in which the bottom TSV surface 502 extends beyond the back side 108, the back side dielectric layer 602 may be formed by depositing a dielectric material (not shown) using any known blanket deposition process. The dielectric material (not shown) may then be planarized using any known planarization process so that the bottom TSV surface 502 is substantially flush with an upper surface of the back side dielectric layer 602.

In an embodiment in which the bottom TSV surface 502 is substantially flush with the back side 108, back side contacts (not shown) may be formed through an entire thickness of the back side dielectric layer 602 after it is formed to connect to the intra-wafer TSVs 104. The back side contacts (not shown) may be substantially similar to the intra-wafer TSVs 104 and may be formed using substantially similar techniques as those described above with reference to FIG. 1.

In an embodiment, a back side wiring layer 608 may be formed over the back side dielectric layer 602. The back side wiring layer 608 may be substantially similar to the backside dielectric layer 602 and may be formed using substantially similar techniques. The back side wiring 604 may be formed in the back side wiring layer 608. The back side wiring 604 may be substantially similar to the $M_x$ wiring 204, the $M_{x+1}$ wiring 210, the $M_{x+2}$ wiring 214, and the $M_{x+3}$ wiring 220 and may be formed using substantially similar techniques as those described above with reference to FIG. 2. However, the back side wiring 604 may be substantially thicker than the $M_x$ wiring 204, the $M_{x+1}$ wiring 210, the $M_{x+2}$ wiring 214, and the $M_{x+3}$ wiring 220. In one embodiment, the back side wiring 604 may have a thickness that is approximately 8 times to approximately 10 times than the thickness of the $M_x$ wiring 204, the $M_{x+1}$ wiring 210, the $M_{x+2}$ wiring 214, and the $M_{x+3}$ wiring 220.

The back side wiring 604 may be electrically connected to the intra-wafer TSVs 104, which may then be connected to the FEOL structures (not shown), and the front side wiring layers 202. In an embodiment, the back side wiring 604 may include one or more separate wiring grids and the intra-wafer TSVs 104 may be connected to different wiring grids. In an embodiment in which back side contacts (not shown) are formed in the back side dielectric layer 602, the back side wiring 604 may be electrically connected to the back side contacts (not shown), which, in turn, connect to the intra-wafer TSVs 104.

Figure 7:
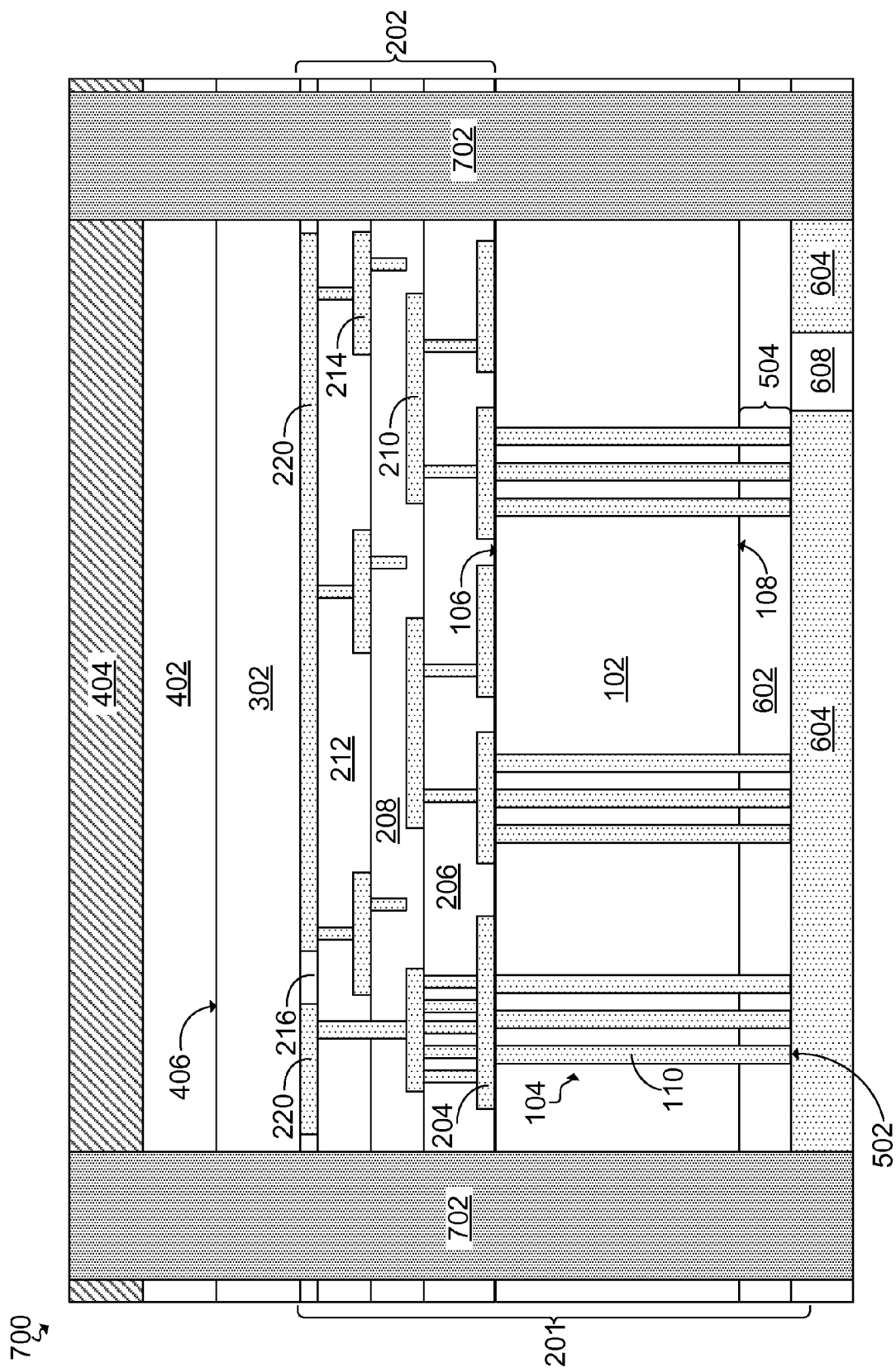
FIG. 7 is a cross-sectional view illustrating forming inter-wafer TSVs through an entire thickness of the first wafer and the second wafer, according to an embodiment of the present invention.

Referring now to FIG. 7, a cross-sectional view of a structure 700 is shown. The structure 700 illustrates a stack of IC chips, and may be referred to as a 3D integrated structure. FIG. 7 illustrates forming inter-wafer TSVs 702 through an entire thickness of the structure 600 (FIG. 6) in an embodiment in which the back side wiring 604 may be connected directly to the intra wafer TSVs 702. The inter-wafer TSVs 702 may be substantially similar to the intra-wafer TSVs 104 and may be formed using substantially similar techniques as those described above with reference to FIG. 1. However, the inter-wafer TSVs 702 may be larger than the intra-wafer TSVs 104. In one embodiment, the inter-wafer TSVs 702 may have a width $W_{702}$ ranging from approximately 0.5 μm to approximately 3 μm. In addition, because the inter-wafer TSVs 702 pass through multiple wafers, each potentially having multiple layers of different compositions, a multi-step etching process may be used. In an embodiment, the inter-wafer TSVs 702 may be formed at or near the periphery of the structure 700, and more specifically, at or near the periphery of the first IC chip 201 and the second IC chip 404.

In another embodiment, the back side wiring 604 may not directly contact the inter-wafer TSVs 702. In this embodiment, the inter-wafer TSVs 702 may be connected to the backside wiring 604 by connection wiring (not shown) formed in a second layer (not shown) of the backside wiring layer 608. The second layer (not shown) of the back side wiring layer 608 may be formed over the back side wiring 604 and the inter-wafer TSVs. The connection wiring (not shown) may be formed in the second layer (not shown) of the back side wiring layer 608 and may contact both the inter-wafer TSVs 702 and the back side wiring 604. The connection wiring (not shown) may be substantially similar to the back side wiring 604 and may be formed using substantially similar techniques as those described above with reference to FIG. 6. The connection wiring (not shown) may electrically connect the two features.

Generally, the inter-wafer TSVs 702 may electrically connect some or all of the stacked wafers in the 3D integrated structure. More specifically, the inter-wafer TSVs 702 may electrically connect the back side of some or all of the stacked wafers in the 3D integrated structure. It should be noted that electrical signals can be distributed throughout the 3D integrated structure using a combination of intra-wafer TSVs, for example the intra-wafer TSVs 104, and inter-wafer TSVs, for example the inter-wafer TSVs 702, in any conceivable configuration.

In the present embodiment, the inter-wafer TSVs 702 may electrically connect the first IC chip 201 to the second IC chip 404. More specifically, the inter-wafer TSVs 702 may electrically connect back side wiring (not shown) in the second IC chip 404 to the back side wiring 604 of the first IC chip 201. The inter-wafer TSVs 702 may serve to carry power or input/output (IO) signals between multiple wafers in the 3D integrated structure. It should be noted that embodiments are contemplated in which 3D integrated structure may have inter-wafer TSVs that carry only power signals, only IO signals, or a combination of both. In any of the above embodiments, the power or input/output (IO) signals can be carried from the inter-wafer TSVs 702 into the back side wiring 604.

In an embodiment in which one of the inter-wafer TSVs 702 carries a power signal, the back side wiring 604 may be electrically connected to that inter-wafer TSV 702. The power signal may be carried from the inter-wafer TSV 702, to the front side wiring layers 202 by way of the back side wiring 604 and the intra-wafer TSVs 104. In an embodiment in which one of the inter-wafer TSVs 702 carries an IO signal, the IO signal may be carried from the inter-wafer TSV 702 to the front side wiring layers 202 by way of the back side wiring 604 and the intra-wafer TSVs 104.

After the inter-wafer TSVs 702 are formed, an additional bonding layer (not shown) may be formed on the back side wiring dielectric layer 608 and the back side wiring 604 in order to bond an additional IC chip (not shown) to the structure 700 using substantially similar techniques as those described above with reference to FIG. 5. The process described above with reference to FIGS. 1-7 may then be repeated to form one ore more additional 3D integrated wafers.

Embodiments of the present invention utilize sub-micro intra-wafer TSVs 104 for intra wafer connections and intra-wafer power distribution and large, low-density, inter-wafer TSVs 702 for inter-strata/wafer connections for signal and/or power distribution. Power and/or IO signals may be carried through multiple IC chips in a stack and distributed to each IC chip through the backside wiring 604 and the intra-wafer TSVs 104 to the front side 106, where it may be distributed to FEOL structures (not shown) and frontside wiring layers 202.

Because of the large width of the inter-wafer TSVs 702 and their location on the periphery of the chips, and the dense connections formed with the intra-wafer TSVs 104, embodiments of the present invention may reduce the area penalty on the frontside 106 of the first IC chip 201 as compared to conventional 3D designs which may use only one size of TSVs (typically larger than the intra-wafer TSVs 104) to form a 3D connection. This arrangement, in turn, may reduce the amount of stress put on the semiconductor substrate 102. In addition, this arrangement may minimize problems associated with bonding misalignment during the formation of a 3D integrated structure because only the inter-wafer TSVs 702 are subject to this misalignment. The intra-wafer TSVs 104 may only subject to lithographic tolerances of the order of approximately 10 nm to approximately 100 nm, depending on the process used during formation.

Considerable front side real estate may be saved by moving a portion of the power distribution to the back side. In typical 2D designs, approximately 20% of wire tracks in front side wiring layers may be reserved only for power distribution. When a portion of this power distribution is moved to the backside, wiring on the front side is freed up for additional signal tracks or additional devices. Also, because the back side wiring 604 may have a large thickness, it may be less resistive compared to the thin wiring layers 202. This may allow longer run lengths of the back side wiring 604, with reduced numbers of repeaters/re-buffers required to distribute signals. In addition, because the larger back side wiring 604 is removed from the smaller front side wiring layers 202, the back side wiring 604 can be optimized solely for a lower voltage drop (IR-drop) instead of having to balance between low RC (required for smaller signal delay) and low IR drop (required for less loss across the power grid) when this grid is formed on the front side.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
   a first integrated circuit (IC) chip having, a first substrate, a front side wiring layer on a front side of the first substrate, a back side wiring layer on a back side of the substrate, and a first through substrate via (TSV) extending through an entire thickness of a first substrate and electrically connecting the front side wiring layer to the back side wire layer;
   a first bonding layer on the front side wiring layer;
   a second bonding layer on the first bonding layer;
   a second IC chip on the second bonding layer; and
   a second TSV extending from the front side of the first substrate through an entire thickness of the first IC chip, the first bonding layer, the second bonding layer, and the second IC chip such that the top surface and the bottom surface of the second TSV is exposed, and wherein the top surface of the second TSV is coplanar with the front side of the first substrate, and wherein the bottom surface of the second TSV is coplanar with the back side wiring layer, the second TSV electrically connecting the first IC chip to the second IC chip;
   a third TSV extending from the front side of the first substrate through an entire thickness of the first IC chip, the first bonding layer, the second bonding layer, and the second IC chip such that the top surface and the bottom surface of the third TSV is exposed, and wherein the top surface of the third TSV is coplanar with the front side of the first substrate, and wherein the bottom surface of the third TSV is coplanar with the back side wiring layer, the third TSV electrically connecting the first IC chip to the second IC chip, wherein the second TSV and the third TSV are each disposed at a periphery of the first IC chip and the second IC chip.

2. The structure of claim 1, wherein the first TSV has a width to height ratio of approximately 1:40.

3. The structure of claim 1, wherein the second TSV has a width that is approximately 1.25 times to approximately 30 times larger than the width of the first TSV.

* * * * *